(12) United States Patent
Twerdochlib et al.

(10) Patent No.: US 7,604,399 B2
(45) Date of Patent: Oct. 20, 2009

(54) TEMPERATURE MONITOR FOR BUS STRUCTURE FLEX CONNECTOR

(75) Inventors: Michael Twerdochlib, Oviedo, FL (US); Evangelos V. Diatzikis, Chuluota, FL (US); Edward D. Thompson, Casselberry, FL (US); David Bateman, Geneva, FL (US)

(73) Assignee: Siemens Energy, Inc., Orlando, FL (US)

( * ) Notice: Subject to any disclaimer, the term of this patent is extended or adjusted under 35 U.S.C. 154(b) by 175 days.

(21) Appl. No.: 11/809,299

(22) Filed: May 31, 2007

(65) Prior Publication Data

US 2008/0298428 A1    Dec. 4, 2008

(51) Int. Cl.
*G01J 5/00* (2006.01)
*G01K 1/00* (2006.01)

(52) U.S. Cl. ............ 374/130; 374/120; 374/124; 374/152

(58) Field of Classification Search ............ 374/130, 374/152, 120, 124
See application file for complete search history.

(56) References Cited

U.S. PATENT DOCUMENTS

| | | | |
|---|---|---|---|
| 3,916,690 A | 11/1975 | Brandli | |
| 4,049,938 A | 9/1977 | Ueno | |
| 4,364,171 A | 12/1982 | Niemann | |
| 4,940,933 A | 7/1990 | Jenkins | |
| 5,315,956 A * | 5/1994 | Reno | 116/216 |
| 5,319,356 A * | 6/1994 | Yoshino | 340/584 |
| 6,252,506 B1 | 6/2001 | Hsieh et al. | |
| 7,002,278 B2 | 2/2006 | Verbanic et al. | |
| 7,253,602 B2 * | 8/2007 | Shvach et al. | 324/127 |
| 2006/0019540 A1 | 1/2006 | Werthman et al. | |
| 2007/0063859 A1 * | 3/2007 | Twerdochlib et al. | 340/679 |

FOREIGN PATENT DOCUMENTS

| | | | |
|---|---|---|---|
| EP | 461837 A2 * | 12/1991 | |
| FR | 2613539 A1 | 10/1988 | |
| JP | 61186826 A * | 8/1986 | |
| JP | 05026738 A * | 2/1993 | |
| JP | 06088753 A * | 3/1994 | |

* cited by examiner

*Primary Examiner*—Lisa M Caputo
*Assistant Examiner*—Mirellys Jagan

(57) ABSTRACT

A temperature monitor for monitoring plural locations on an electrical bus structure. The temperature monitor includes an infrared sensor for receiving infrared energy from a plurality of discrete predetermined locations on the bus structure, a first member defining a stationary first mask, a second member defining a rotating second mask, and a drive member driving the second member in rotation relative to the first member. Rotation of the second member relative to the first member defines an aperture translated across the first mask member to provide a moving line-of-sight that extends from the sensor and that scans to each of the discrete predetermined locations on the bus structure.

20 Claims, 3 Drawing Sheets

TEMPERATURE MONITOR FOR BUS STRUCTURE FLEX CONNECTOR

FIELD OF THE INVENTION

The present invention relates to temperature monitor and, more particularly, to a temperature monitor for providing temperature measurements taken at predetermined locations across a flexible connection of an isolated phase electrical bus conductor.

BACKGROUND OF THE INVENTION

Large industrial electromagnet machines, such as large electrical generators used in power plants operate at extremely high energy levels. For example, large steam powered generators may operate at voltages on the order of 20,000 VAC and currents on the order of 20,000 Amps AC. The electrical power from the generator is typically carried to high potential step-up transformers by a power conductor structure comprising three large copper bus structures that are isolated from each other and are commonly known as isolated phase, or isophase, bus structures. Each isophase bus structure includes flexible connections, formed by flexible copper straps, located at spaced intervals along the bus structure. For example, there may be a flexible strap connection located every six to twenty feet along the bus structure. The flexible connections typically comprise multiple heavy flexible copper straps having opposing ends that are bolted into place on adjacently located sections of the bus structure. The flexible copper straps accommodate thermally induced expansion of the bus structures that can result from the high current transported through these structures. Large steam powered units may have up to forty flexible copper straps per flexible connection between the adjacent sections of the bus structure.

Temperature changes along the isophase bus structure, such as may result from changes in the power conducted through the bus structure, can cause the bolts at either end of the flexible straps to loosen as the bus structures expand and contract. A loose connection at the interface between the flexible straps and the adjacent sections of the bus structure will result in decreased current flow in the loosened strap, causing an increase in the temperature of the remaining properly attached straps as they carry the current of the loosened strap, potentially resulting in further loosening of the bolts connecting the flexible straps.

The flexible strap connections are enclosed in an isophase bus shell that surrounds the bus structure and is typically 30 to 60 inches in diameter. Accordingly, observation of the flexible connections is obstructed by the bus shell, making it difficult to monitor the condition of the flexible connections. A final failure of the bus structure generally occurs suddenly, with little or no warning since operation with only a few of the flexible straps securely in place may be sufficient to avoid or minimize a voltage drop across the flexible connection until the failure of the bus structure occurs. In particular, if a failure of the straps progresses to the end, there may be a big electrical arc that blows out the section of the isophase bus structure at the location of the strap failure. The resulting ground fault will trip the generator. However, current will continue to flow through the bus, providing energy to support the arc, until the large amount of energy in the generator rotor field has decayed and been converted to heat. Replacement parts to repair such a failure are often difficult to obtain quickly, such that a bus failure may result in an extended unplanned outage.

It is known to provide an infrared monitoring device for measuring the temperature of a flexible connection on an isophase bus. For example, such an infrared monitoring device comprised an open aperture sensor, such as a thermopile, where the geometry of the aperture provided a wide field of view. Only a small portion of the field of view for the aperture included the flexible straps, and a relatively large portion of the field of view included the inner surface of the bus shell. Accordingly, changes in the temperature of the inner surface of the shell, which have a substantially higher energy output than the flexible straps, produce a greater effect on the readings of the monitoring device than even large changes in the temperature of the flexible straps.

In an alternative implementation of the above-described monitoring technique, an infrared lens is positioned at the aperture to narrow the field of view seen by the sensor, and thus limit the field of view to the area of the flexible straps. Although addition of the infrared lens has been effective to narrow the field of view to monitor the flexible straps, there are still negative factors associated with this technique including the cost of the infrared lenses significantly increasing the expense of the system. In addition, infrared lenses generally have a wavelength band where they do not pass infrared radiation, and the lens provides an exposed optical surface that may collect dirt and/or dust to cause an erroneous low temperature measurement due to a reduction in the energy transmitted through the lens to the sensor. Further, even with the addition of the infrared lens, the monitoring device still only provides an average temperature measurement made across all of the straps located in the field of view of the lens, rather than enabling temperature measurements of the individual straps in the connection.

SUMMARY OF THE INVENTION

In accordance with one aspect of the invention, a temperature monitor is provided for monitoring plural locations on a structure. The temperature monitor comprises a sensor for receiving energy indicative of a temperature of a plurality of locations spaced from the sensor, a first member located between the sensor and the plurality of locations, the first member defining a first aperture, and a second member located between the sensor and the plurality of locations, the second member defining a second aperture. At least one of the first and second members is movable relative to the other of the first and second members to produce relative movement between the first and second apertures. The relative movement between the first and second apertures provides an unobstructed first line-of-sight between the sensor and at least a first location of the plurality of locations, permitting the sensor to receive energy indicative of a temperature of the first location.

In accordance with another aspect of the invention, a temperature monitor is provided for monitoring plural locations on an electrical bus structure. The temperature monitor comprises an infrared sensor for receiving infrared energy from a plurality of discrete predetermined locations on a bus structure, a first member comprising a stationary first mask, a second member comprising a rotating second mask, and a drive member driving the second member in rotation relative to the first member. Rotation of the second member relative to the first member defines an aperture translated across the first mask member to provide a moving line-of-sight that extends from the sensor and that scans to each of the discrete predetermined locations on the bus structure.

In accordance with a further aspect of the invention, a method of monitoring temperature at plural locations on an electrical bus structure is provided. The method comprises the steps of providing a temperature sensor at a location in spaced relation to an electrical conductor, providing a mask structure between the electrical conductor and the sensor, the mask structure comprising a first mask and a second mask, defining a plurality of lines of sight from the sensor to the electrical conductor by moving the second mask relative to the first mask, and determining a temperature at each of a plurality of laterally spaced locations on the electrical conductor, where each of the locations corresponds to a distinct angle defined by a line-of-sight extending from the sensor and passing through the mask structure to the electrical conductor.

BRIEF DESCRIPTION OF THE DRAWINGS

While the specification concludes with claims particularly pointing out and distinctly claiming the present invention, it is believed that the present invention will be better understood from the following description in conjunction with the accompanying Drawing Figures, in which like reference numerals identify like elements, and wherein:

DETAILED DESCRIPTION OF THE INVENTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

Figure 1:
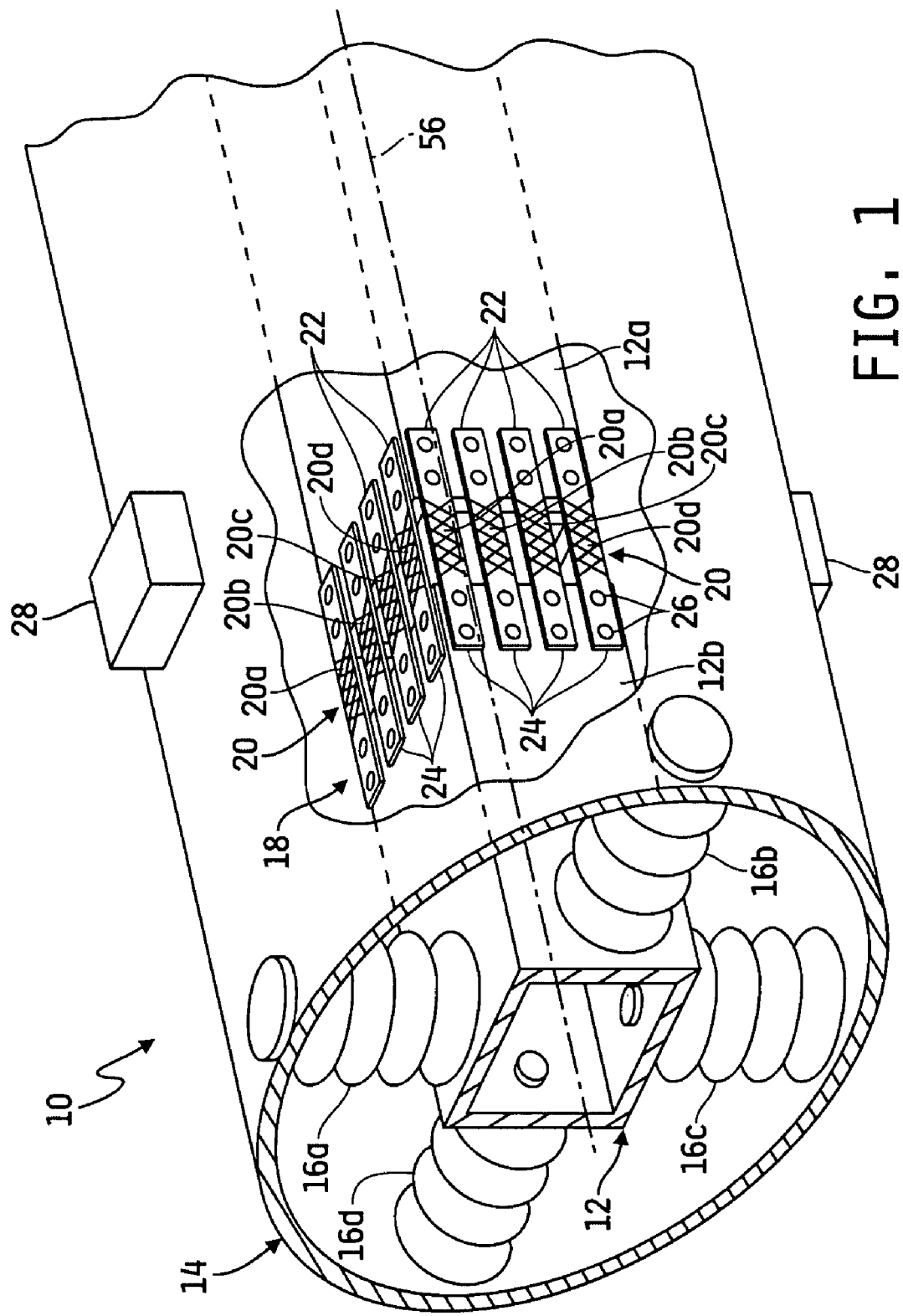
FIG. 1 is a partially cut away perspective view of an isophase bus structure including a temperature monitor in accordance the present invention.

Referring to FIG. 1, an isophase bus structure 10 is illustrated including an electrical bus conductor 12 supported within an enclosure or shell 14 by a plurality of insulator assemblies 16a, 16b, 16c, 16d. In the illustrated bus structure 10, the electrical conductor 12 is configured with a square cross-section and is supported by four insulator assemblies 16a, 16b, 16c, 16d, however, the present invention is not limited to this particular configuration for the electrical conductor 12 and other configurations, such as conductors having a circular configuration, may be incorporated in accordance with the principles of the invention described herein.

The electrical conductor 12 is typically formed with one or more flexible connections 18, illustrated herein by a set of straps 20 comprising four laterally spaced straps 20a, 20b, 20c, 20d extending along each side of the electrical conductor 12 between longitudinally spaced conductor sections 12a, 12b of the electrical conductor 12. Each strap 20a, 20b, 20c, 20d preferably comprises a flexible copper strap and includes opposing ends 22, 24 attached to the respective conductor sections 12a, 12b. The ends 22, 24 are generally fastened in position on the conductor sections 12a, 12b by bolts 26. The flexible connection 18 accommodates thermally induced movements between the conductor sections 12a, 12b, where the sets of straps 20 will flex as the gap between the conductor sections 12a, 12b increases and decreases.

In the event that the bolted connections at the ends 22, 24 of one or more of the straps 20a, 20b, 20c, 20d become loose, a loss of current may occur across the connection of the loosened strap with an associated decrease in temperature, and a proportional increase in the temperature of the remaining straps 20a, 20b, 20c, 20d at the flexible connection 18. In order to detect such temperature changes, indicative of a current drop in the loosened strap 20a, 20b, 20c, 20d, each of the sets of straps 20 may be monitored by a temperature monitor unit 28 mounted on the shell 14. Specifically, a temperature monitor unit 28 (only two shown) may be mounted opposite each set of straps 20 located on each side of the electrical conduit 12 at the flexible connection 18.

Figure 2:
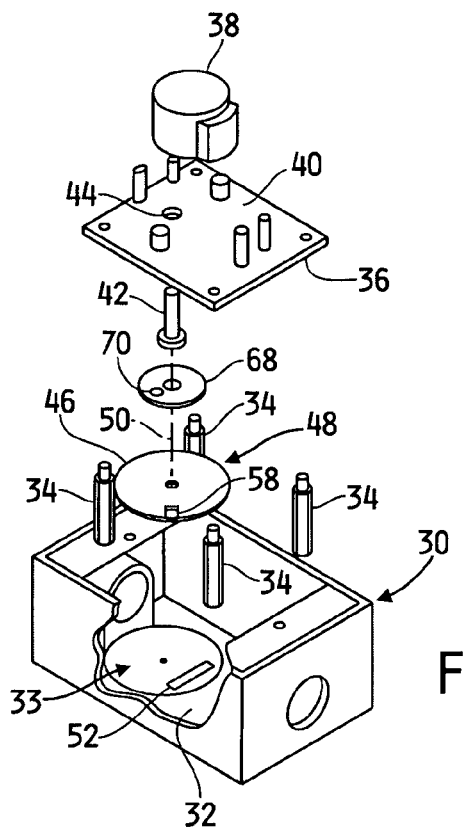
FIG. 2 is an exploded view of a temperature monitor illustrating the present invention.

Referring to FIG. 2, an exploded view of a temperature monitor unit 28 is shown and includes a housing 30 having an inner wall 32. The inner wall 32 may be formed to define a first mask member 33 comprising a circular area. A plurality of elongated support members 34 are attached to the inner wall 32 and provide a mount for supporting a circuit board 36 in spaced relation to the inner wall 32. The circuit board 36 defines a stationary base for supporting a drive member, such as a motor 38, on an outer side 40 thereof. A rotatable motor shaft 42 is driven by the motor 38 and passes through a hole 44 in the circuit board 36 to support a rotatable disk member 46, defining a second mask member 48. The first and second mask members 33, 48 are located in close association with each other to define a mask structure. The motor shaft 42 extends along a rotation axis 50 that extends centrally through the first mask member 33 to support the disk member 46 for rotation concentrically with the first mask member 33.

The first mask member 33 includes a first elongated aperture 52 extending through the inner wall 32. The first aperture 52 is configured as an elongated straight slot extending along a line 54 (FIG. 3) that is spaced from the rotation axis 50 and is generally parallel to a tangent of the first mask member 33. The line 54 defining the extension of the first aperture 52 is generally perpendicular to a longitudinal axis 56 (FIG. 1) of the electrical conductor 12 when the monitor unit 28 is located in an operable position on the shell 14, as illustrated in FIG. 1.

Figure 3:
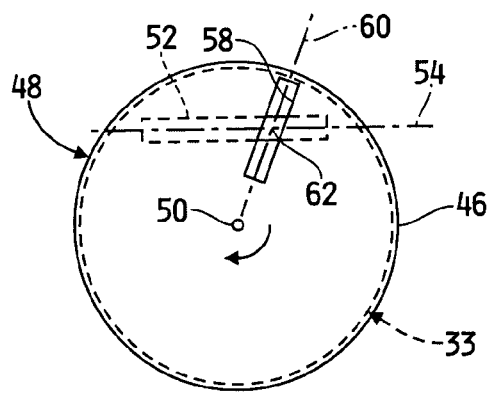
FIG. 3 is a diagrammatic illustration of cooperating mask structures for the temperature monitor of FIG. 2.

As seen in FIG. 3, the second mask member 48 includes a second aperture 58 that is configured as an elongated straight slot extending transversely to the first aperture 52 along a line 60 radially outwardly from the rotation axis 50. The relative locations of the first aperture 52 and the second aperture 58 are such that the second aperture 58 intersects the first aperture 52 as the disk member 46 rotates to define a quadrangular line-of-sight aperture 62. The line-of-sight aperture 62 moves along the line 54 within the length of the first aperture 52 as the second aperture 58 sweeps across the first aperture 52 to provide a moving line-of-sight extending from a sensor 64 to the straps 20a, 20b, 20c, 20d of the flexible connection 18. The sensor 64 may comprise a thermopile or equivalent infrared sensor for sensing infrared energy received from the straps 20a, 20b, 20c, 20d.

Figure 4:
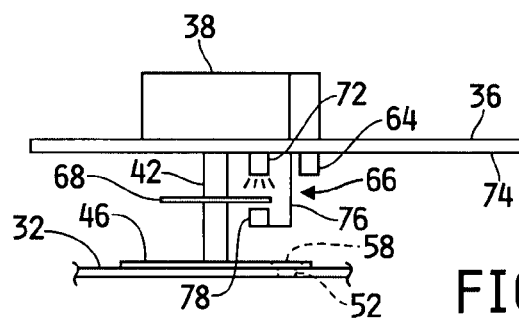
FIG. 4 is a diagrammatic side elevation view illustrating a position sensor for the temperature monitor of FIG. 2.

Referring to FIG. 4, the position of the line-of-sight aperture 62 may be determined by a position sensor unit 66. The position sensor unit 66 may comprise an encoder wheel 68 (see also FIG. 2) mounted to the shaft 42 and including at least one position aperture 70, a light source 72 mounted to one side of the encoder wheel 68, such as mounted to an inner side 74 of the circuit board 36, and a support member 76 holding an optical sensor 78 in position adjacent a side of the encoder wheel 68 opposite the light source 72. As the disk member 46 is rotated by the shaft 42, the encoder wheel 68 rotates and causes the position aperture 70 to pass between the light source 72 and the optical sensor 78 to cause the sensor 78 to trigger as an indication of the rotational position of the shaft 42. The circuit board 36 may include circuitry to monitor the position of the shaft 42 in order to provide the corresponding location of the line-of-sight aperture 62.

It should be noted that the light source 72 may be an LED or any equivalent light source. Further, it should be understood that the present invention is not limited to the described encoder structure and that other rotational position sensing structures may be incorporated in the structure described herein.

Referring to FIGS. 5A-5D, the successive movement of the line-of-sight from the temperature monitor unit 28 to different locations on a respective set of straps 20 is illustrated diagrammatically with reference to the plurality of straps 20a, 20b, 20c, 20d arranged perpendicular to a line 79 extending perpendicular to the longitudinal axis 56. The line 79 may comprise a line that is substantially collinear with the rotation axis 50 of the shaft 42. FIGS. 5A-5D illustrate distinct angles φ of a line-of-sight from the sensor 64 to each of the locations of the straps 20a, 20b, 20c, 20d.

Figure 5A:
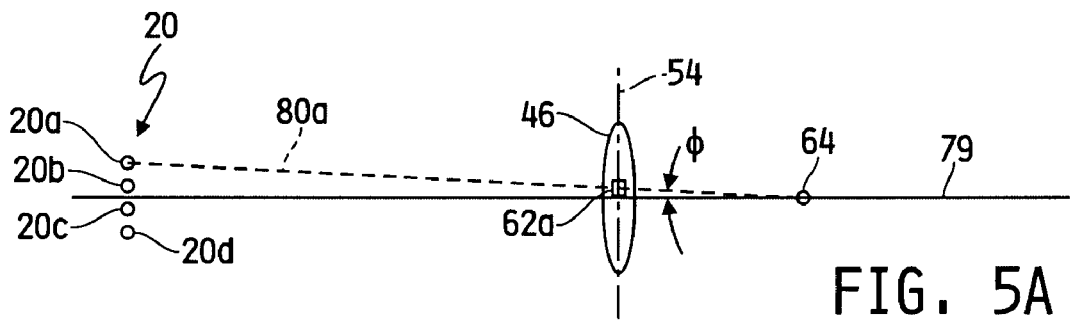
FIGS. 5A-5D are diagrammatic illustrations of the operation of the temperature sensor sequentially obtaining a temperature reading from a series of adjacent locations on an electrical conductor of the isophase bus structure.
Figure 5B:
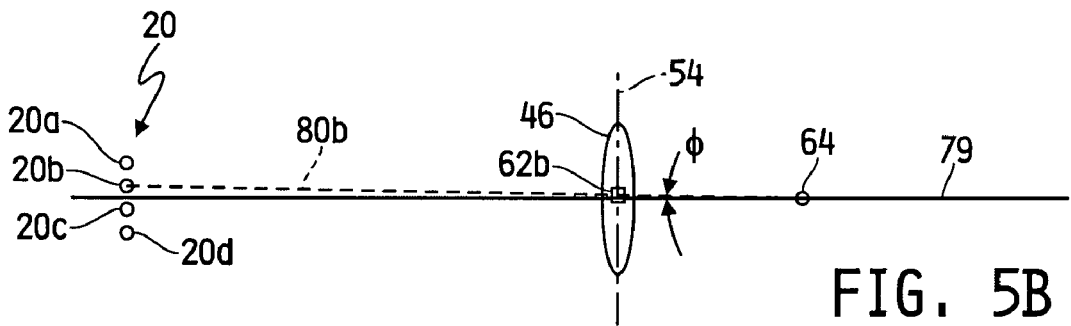
Figure 5C:
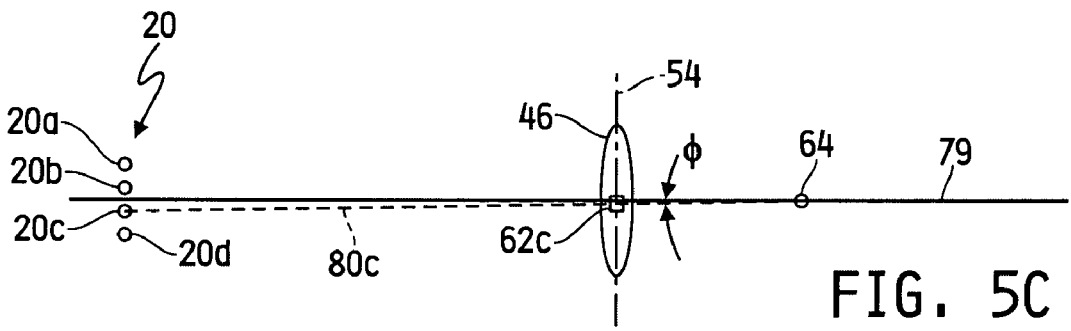
Figure 5D:
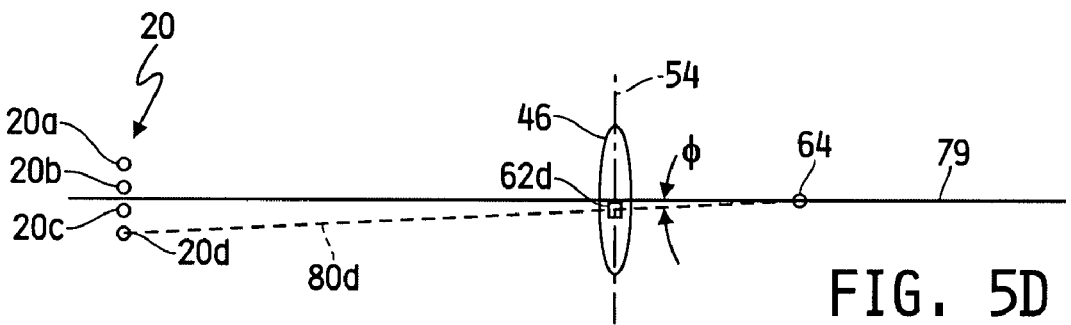

FIG. 5A illustrates a first position of the line-of-sight aperture, indicated by 62a, defining a straight line-of-sight 80a between the sensor 64 and the strap 20a. Further, the field-of-view provided to the sensor 64 comprises essentially only the strap 20a, and the surrounding background areas are substantially blocked out. As the disk member 46 rotates, the line-of-sight aperture moves to a second position, indicated by 62b, where a straight line-of-sight 80b is defined between the sensor and the strap 20b. It should be noted that as the disk member 46 rotates to the second aperture position 62b, energy from the first strap 20a is blocked out, as well as energy from substantially all other background areas surrounding the strap 20b, to essentially provide a limited field-of-view centered on the strap 20b from which energy is received.

Similarly, further rotation of the disk member 46 causes the line-of-sight to pass through two subsequent defined aperture positions 62c and 62d corresponding to straight lines-of-sight 82c and 82d extending from the sensor 64 to the straps 20c and 20d, respectively. It should be understood that the motor 38 drives the shaft 42 at a slow enough speed to permit the sensor 64 to respond to the energy emitted by the particular strap 20a, 20b, 20c, 20d located within the line-of-sight defined through the aperture 62 to the sensor 64.

The signal generated by the position sensor unit 66 may be used to trigger the temperature sensing operation at a predetermined point in the rotation of the shaft 42, such as at a location where the first position of the aperture 62a is formed by the intersection of the first and second apertures 52, 58. The motor 38 may comprise a stepper motor or other motor for providing a controlled rotation of the shaft 42. In addition, the encoder wheel 68 for the position sensor unit 66 may include a plurality of position apertures 70 where, for example, each position aperture 70 may be indicative of a line-of-sight aperture position 62a, 62b, 62c, 62d. By providing a temperature measurement associated with each one of a plurality of locations on the flexible connection 18, it is possible to identify a particular overheated strap 20a, 20b, 20c, 20d, and additionally enables a trending analysis of the temperature of each of the straps 20a, 20b, 20c, 20d, to provide an indication of a degrading condition within the flexible connection 18.

Additional line-of-sight aperture positions may be provided if, for example, the set of straps 20 includes additional straps, or to provide a temperature measurement for locations other than the straps 20a, 20b, 20c, 20d on the flexible connection 18. Specifically, it may be desirable to obtain at least one temperature measurement from the interior surface of the shell 14 in order for temperature changes of the straps 20a, 20b, 20c, 20d to be adjusted with reference to the environmental or background temperature of the enclosed area of the isophase bus structure 10. In order to obtain the background temperature, a further line-of-sight aperture position may be provided extending to the side of either of the edge straps 20a or 20d in order for the line-of-sight to extend past the flexible connection 18 of the electrical conductor 12 to the interior wall surface of the shell 14. The interior surface temperature obtained from the shell 14 may be subtracted from the measured strap temperatures to provide adjusted strap temperature measurements.

It should be noted that the shape of the first and second masks 33, 48 and first and second apertures 52, 58 is provided for convenience in the present explanation, and alternative shapes or configurations of these components may be provided within the scope of the present invention. For example, the apertures 52, 58 may be provided with shapes that vary across their length dimensions configured such that the area of the line-of-sight aperture 62 at any given temperature measurement location is equivalent to the area at every other location. Alternatively, a microprocessor may be provided to process the signal from the sensor 64 and compensate for the known variations in the aperture size, where the known position of the line-of-sight aperture 62 as it moves along the line 54 may be used in combination with a look-up table to adjust the measured temperature readings with reference to the particular known dimensional characteristics of the aperture 62 for any given position. It should be understood that the apertures 52, 58 could be any aperture configuration capable of cooperating to provide a limited field-of-view from the sensor 64 to spatially distinct locations.

In a further modification of the invention, the disk member 46 may be provided with a plurality of the apertures 58 located at predetermined circumferentially spaced locations around the disk member 46. In such a construction, a temperature measurement of the straps 20a, 20b, 20c, 20d may be obtained each time one of the plurality of apertures 58 sweeps across the aperture 52.

The temperature monitor unit 28 may be formed as a completely contained module that may include the above-described temperature detection structure as well as a motor controller, an infrared detection circuit, process logic, and alarm logic to provide an alert corresponding to an overheat condition. The units 28 may be mounted as independent monitors at selected locations on the shell 14 and may be connected in any selected configuration to a common display box to provide a temperature monitor system for the isophase bus structure 10.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A temperature monitor for monitoring plural locations on a structure, said temperature monitor comprising:
   a sensor for receiving energy indicative of a temperature of a plurality of locations spaced from said sensor;
   a first member located between said sensor and said plurality of locations, said first member defining a first aperture comprising an elongated first slot;

a second member located between said sensor and said plurality of locations, said second member defining a second aperture comprising an elongated second slot, said first and second slots defining directions of elongation transverse to each other;

at least one of said first and second members being movable relative to the other of said first and second members to produce relative movement between said first and second apertures; and wherein said relative movement between said first and second apertures provides an unobstructed first line-of-sight through said first and second slots between said sensor and at least a first location of said plurality of locations, permitting said sensor to receive energy indicative of a temperature of said first location.

2. The temperature monitor of claim 1, wherein said sensor comprises an infrared sensor.

3. The temperature monitor of claim 1, wherein continued relative movement between said first and second members obstructs said first line-of-sight between said first location and said sensor to prevent said sensor from receiving energy from said first location.

4. The temperature monitor of claim 3, wherein said continued relative movement between said first and second members provides a second unobstructed line-of-sight through said first and second slots between a second location of said plurality of locations and said sensor, permitting said sensor to receive energy indicative of a temperature of said second location.

5. The temperature monitor of claim 4, wherein at least one of said first and second members is driven in rotational movement relative to the other of said first and second members.

6. The temperature monitor of claim 1, wherein said plurality of locations comprise a plurality of laterally spaced members and including a position indicating member providing an indication of a position of a line-of-sight between each of said laterally spaced members and said sensor.

7. The temperature monitor of claim 6, including said sensor providing a line-of-sight between said sensor and at least one location spaced from said laterally spaced members to receive energy indicative of a background temperature.

8. The temperature monitor of claim 7, wherein said laterally spaced members comprise a plurality of spaced conductive straps in an electrical bus structure.

9. A method of monitoring temperature at plural locations on an electrical bus structure including an electrical conductor, the method comprising the steps of:

providing a temperature sensor at a location in spaced relation to the electrical conductor;

providing a mask structure between said electrical conductor and said sensor, said mask structure comprising a first mask and a second mask;

defining a plurality of lines of sight from said sensor to said electrical conductor by moving said second mask relative to said first mask; and determining a temperature at each of a plurality of laterally spaced locations on said electrical conductor, where each of said locations corresponds to a distinct angle defined by a single unobstructed line-of-sight extending from said sensor and passing through said mask structure to said electrical conductor, and wherein each temperature measurement is obtained from enemy transmitted from a single corresponding location while blocking said sensor from receiving enemy from all other ones of said laterally spaced locations.

10. The method of claim 9, wherein said spaced locations on said electrical conductor comprise spaced conductive straps.

11. The method of claim 9, wherein said first mask comprises an elongated slot, and relative movement between said first and second masks causes said line-of-sight to move along a length of said elongated slot.

12. The method of claim 9, wherein said line-of-sight is defined by an aperture formed by said mask structure and moving in a linear path between said sensor and said electrical conductor.

13. The method of claim 12, wherein said step of moving said second mask relative to said first mask comprises rotating said second mask.

14. The method of claim 13, wherein said first mask comprises a first elongated slot and said second mask comprises a second elongated slot located in overlapping relation to said first slot to define said aperture and said first and second slots define directions of elongation transverse to each other.

15. A temperature monitor for monitoring plural locations on a structure, said temperature monitor comprising:

a sensor for receiving energy indicative of a temperature of a plurality of locations spaced from said sensor, said plurality of locations comprising a plurality of laterally spaced members;

a first member located between said sensor and said plurality of locations, said first member defining a first aperture;

a second member located between said sensor and said plurality of locations, said second member defining a second aperture;

at least one of said first and second members being movable relative to the other of said first and second members to produce relative movement between said first and second apertures;

a position indicating member providing an indication of a position of a line-of-sight between each of said laterally spaced members and said sensor; and wherein said relative movement between said first and second apertures provides an unobstructed first line-of-sight between said sensor and at least a first location of said plurality of locations, permitting said sensor to receive energy indicative of a temperature of said first location, and said sensor providing a line-of-sight between said sensor and at least one location spaced from said laterally spaced members to receive energy indicative of a background temperature.

16. The temperature monitor of claim 15, wherein said first and second members cooperate to mask said sensor from receiving infrared energy from more than one of said lateral members at a time.

17. The temperature monitor of claim 15, wherein said structure comprises an electrical bus structure including a plurality of laterally spaced conductive straps, and each of said laterally spaced members comprises one of said conductive straps.

18. The temperature monitor of claim 15, wherein said sensor comprises an infrared sensor for receiving infrared energy from said plurality of laterally spaced members.

19. The temperature monitor of claim 15, wherein said first member comprises a first elongated slot and said second member comprises a second elongated slot.

20. The temperature monitor of claim 19, wherein said second slot is located in overlapping relation to said first slot to define said aperture and said first and second slots define directions of elongation transverse to each other.

* * * * *